United States Patent [19]

Mandai et al.

[11] Patent Number: 5,093,986

[45] Date of Patent: Mar. 10, 1992

[54] METHOD OF FORMING BUMP ELECTRODES

[75] Inventors: Harufumi Mandai; Yoshikazu Chigodo; Atsushi Tojyo, all of Nagaokakyo, Japan

[73] Assignee: Murata Manufacturing Co., Ltd., Japan

[21] Appl. No.: 650,308

[22] Filed: Feb. 4, 1991

[30] Foreign Application Priority Data

Feb. 5, 1990 [JP] Japan .................................. 1-26976

[51] Int. Cl.⁵ .............................................. H01R 9/09
[52] U.S. Cl. ........................................ 29/843; 29/842; 29/877; 228/179
[58] Field of Search ......................... 29/842, 843, 877; 427/205; 228/179; 156/297

[56] References Cited

U.S. PATENT DOCUMENTS 3,795,047 3/1974 Abolafia et al. ........................ 29/843
4,829,664 5/1989 Kabeshita et al. ..................... 29/834
4,857,482 8/1989 Saito et al. ............................. 29/739

FOREIGN PATENT DOCUMENTS 1-84992 7/1989 Japan .................................. 228/179

OTHER PUBLICATIONS

Martin, B. D. et al., Chip Protective Coating, IBM Tech. Discl., Bull., vol. 23, No. 5, Oct. 1980.

Primary Examiner—P. W. Echols
Attorney, Agent, or Firm—Ostrolenk, Faber, Gerb & Soffen

[57] ABSTRACT

A method of forming bump electrodes, which is characterized in that conductive pastes are applied to a surface on which bump electrodes are to be formed, metal balls are made to adhere to the applied conductive pastes utilizing the viscosity of the conductive pastes before the conductive pastes are dried, and the conductive pastes and the metal balls are cofired.

8 Claims, 2 Drawing Sheets

METHOD OF FORMING BUMP ELECTRODES

BACKGROUND OF THE INVENTION

1. Field of the Invention

The present invention relates generally to a method of forming bump electrodes provided on the reverse side of a circuit board or an electronic component, and more particularly, to a method of efficiently forming bump electrodes using simple facilities.

2. Description of the Prior Art

In many cases, bump electrodes have been conventionally formed on the reverse side of a circuit board utilizing ceramics or an electronic component such as a hybrid IC so as to increase integration density. The bump electrode means an electrode formed in a shape swollen out of a surface on which electrodes are to be formed. A conventional method of forming bump electrodes will be described with reference to FIG. 4. In FIG. 4, bump electrodes 2 and 3 are formed on a reverse surface 1a of a circuit board 1 made of ceramics (the circuit board 1, however, is so illustrated that the reverse surface faces up).

The bump electrodes 2 and 3 are formed on the reverse surface 1a of the circuit board 1 by brazing metal balls 4 and 5 using braze metals 6 and 7.

The reason why projected shapes of the bump electrodes 2 and 3 are formed using the metal balls 4 and 5 is that it is easy to make the heights of portions projected from the reverse surface 1a of the circuit board 1 equal to each other.

Since the metal balls 4 and 5 are brazed using the braze metals 6 and 7, however, an apparatus for applying heat to a high temperature is required, resulting in large-scaled facilities. Furthermore, the production processes are complicated.

SUMMARY OF THE INVENTION

Accordingly, an object of the present invention is to provide a method in which bump electrodes can be efficiently formed using relatively simple facilities.

A method of forming bump electrodes according to the present invention comprises the steps of applying conductive pastes to a surface on which bump electrodes are to be formed, making metal balls adhere to the applied conductive pastes utilizing the viscosity of the conductive pastes before the conductive pastes are dried, and firing the conductive pastes integrally with the metal balls.

The conductive pastes can be fired using a small-sized apparatus for applying heat to a relatively low temperature. In addition, the conductive pastes can be fired for a relatively short time. Consequently, the bump electrodes can be efficiently formed using low-cost and small-sized production facilities.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A method of forming bump electrodes according to one embodiment of the present invention will be described with reference to FIGS. 1 and 2.

Figure 2:
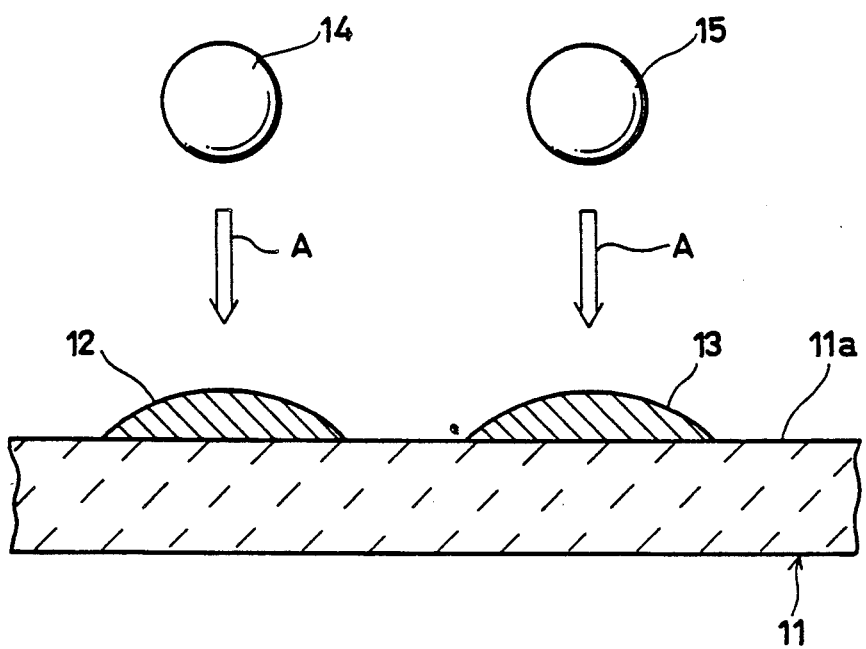
FIG. 2 is a cross sectional view for explaining the process of making metal balls adhere to conductive pastes according to one embodiment of the present invention.

As shown in FIG. 2, a circuit board 11 is first prepared. Conductive pastes 12 and 13 are applied to a reverse surface 11a of the circuit board 11. The conductive pastes 12 and 13 are respectively applied by suitable amounts to regions where bump electrodes are to be formed.

A mixture of powder of a metal such as Cu or Ag or an alloy such as an Ag-Pd alloy and an organic binder is used as the conductive pastes 12 and 13. Synthetic resin of a cellulose system is used as the organic binder. The organic binder is used in a state where it is diluted in a suitable solvent. Consequently, the conductive pastes 12 and 13 are viscous in a state where they have not been dried.

In the present embodiment, the metal balls 14 and 15 are pressed onto the conductive pastes 12 and 13, as represented by arrows A, and are made to adhere thereto utilizing the viscosity of the conductive pastes 12 and 13 before the conductive pastes 12 and 13 applied are dried.

As a material for constituting the metal balls, an arbitrary metal such as copper or nickel or an alloy can be used. The surfaces of the metal balls may be plated as required. It is possible to apply antirust to the metal balls 14 and 15 by plating. Further, it is also possible to make joining work using solder easy by solder plating or the like.

The metal balls 14 and 15 and the conductive pastes 12 and 13 are then fired with the metal balls 14 and 15 adhering to the conductive pastes 12 and 13. This firing is achieved using an apparatus for applying heat to a relatively low temperature, for example, approximately 850° to 1000° C., unlike brazing. Furthermore, the metal balls 14 and 15 and the conductive pastes 12 and 13 can be processed for a relatively shorter time, as compared with brazing.

Figure 1:
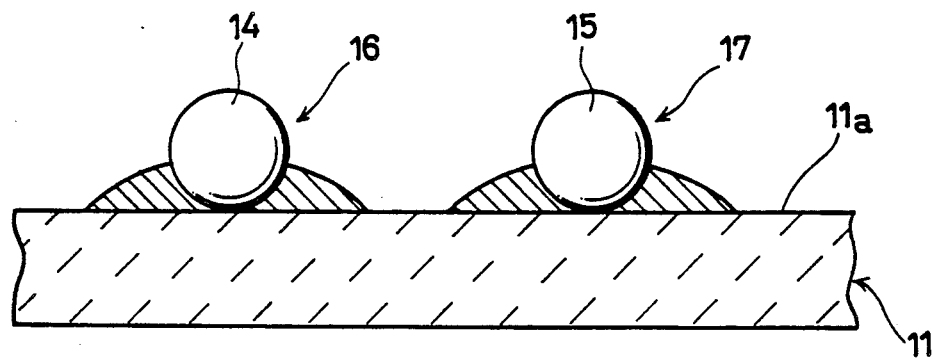
FIG. 1 is a cross sectional view for explaining bump electrodes formed according to one embodiment of the present invention.

A state where the firing is completed is shown in the cross sectional view of FIG. 1. Bump electrodes 16 and 17 are formed on the reverse surface 11a of the circuit board 11 by the above described firing.

As obvious from FIG. 1, the metal balls 14 and 15 are fixed with them being embedded in the solidified conductive pastes 12 and 13 so as to come into contact with the reverse surface 11a of the circuit board 11. This is because the heights of the bump electrodes 16 and 17, that is, the heights, which are projected from the circuit board 11, of the metal balls 14 and 15 are made equal to each other.

However, when the metal balls 14 and 15 are made to abut on the reverse surface 11a of the circuit board 11 as described above so as to make the heights of the metal balls 14 and 15 equal to each other, the thicknesses of the conductive pastes 12 and 13 serving as joint materials may, in some cases, be made smaller in the vicinities of portions where the metal balls 14 and 15 abut on the reverse surface 11a of the circuit board 11, resulting in decreased adhesive power.

When the decrease in adhesive power becomes a problem, it is preferable to use to the following method.

Figure 3:
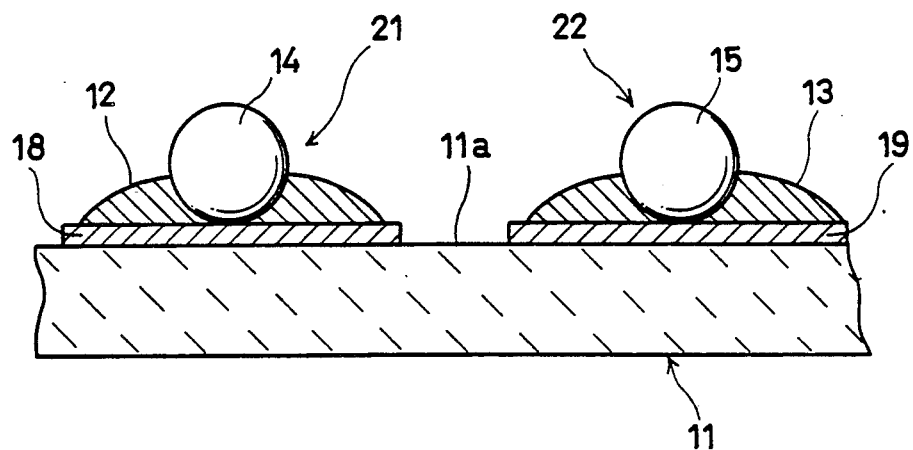
FIG. 3 is a cross sectional view for explaining bump electrodes formed according to another embodiment of the present invention.
Figure 4:
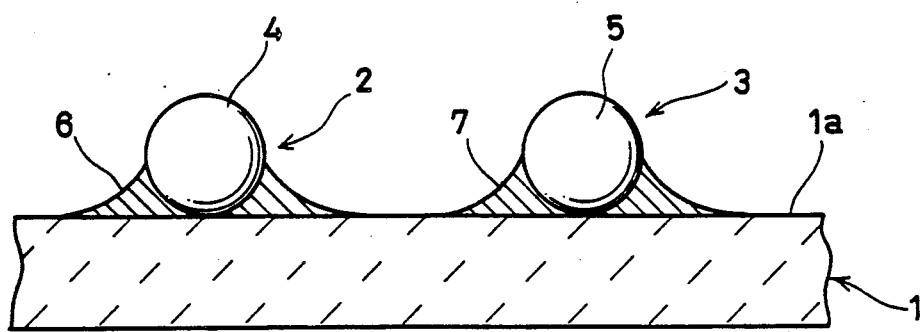
FIG. 4 is a cross sectional view for explaining bump electrodes formed in the conventional method.

More specifically, as shown in the cross sectional view of FIG. 3, conductive pastes 18 and 19 are first applied on a reverse surface 11a of a circuit board 11 and dried. Thereafter, conductive pastes 12 and 13 are applied to the dried conductive pastes 18 and 19 in the same manner as the above described embodiment, metal balls 14 and 15 are embedded to enter a state where the metal balls 14 and 15 abut on the upper surfaces of the conductive pastes 18 and 19 before the conductive pastes 12 and 13 are dried, and the metal balls 14 and 15 and the conductive pastes 12 and 13 are cofired in the state.

In bump electrodes 21 and 22 formed as shown in FIG. 3, the metal balls 14 and 15 are not in direct contact with the reverse surface 11a of the circuit board 11 made of ceramics but are joined to the circuit board 11 while being separated by electrode portions based on the conductive pastes 18 and 19. Consequently, it is possible to make the metal balls 14 and 15 firmly adhere to the circuit board 11.

Moreover, the bump electrodes can be made higher and electrical contact of the metal balls 14 and 15 with the conductive pastes 12 and 13 becomes good by interposing the conductive pastes 18 and 19.

Meanwhile, in either method according to the above described embodiment, the heights of the metal balls 14 and 15 may be finally made equal to each other by applying the grinding process such as lap grinding after the adhesion and firing of the metal balls 14 and 15.

Furthermore, in actual production, the following method may be used as a method of making the metal balls 14 and 15 adhere to the conductive pastes 12 and 13: a method of arranging on the conductive pastes 12 and 13 jigs provided with holes corresponding to the diameters of the metal balls 14 and 15, dropping the metal balls 14 and 15 through the holes and making the metal balls 14 and 15 adhere to conductive pastes 12 and 13, or a method of previously applying conductive pastes to the metal balls 14 and 15 and then, making the metal balls 14 and 15 adhere to the conductive pastes 12 and 13 applied to the circuit board 11.

Although in the above described embodiments, description was made of a case where bump electrodes are formed on the reverse surface 11a of the circuit board 11, the present invention is also applicable to a case where bump electrodes are formed on a surface on which an electronic component such as a hybrid IC is to be mounted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming bump electrodes, comprising the steps of:

applying conductive pastes to a surface on which bump electrodes are to be formed;

making metal balls adhere to the applied conductive pastes utilizing the viscosity of the conductive pastes before the conductive pastes are dried; and firing the conductive pastes integrally with the metal balls.

2. The method according to claim 1, wherein the surfaces of said metal balls are plated so as to prevent rust.

3. The method according to claim 1, wherein the surfaces of said metal balls are solder-plated.

4. The method according to claim 1, which further comprises the step of grinding the metal balls so as to make the heights of the metal balls equal to each other after the firing.

5. The method according to claim 1, wherein the step of applying conductive pastes to a surface on which bump electrodes are to be formed comprises the steps of applying and drying first conductive pastes and applying second conductive pastes to the first conductive pastes dried.

6. The method according to claim 5, wherein the surfaces of said metal balls are plated so as to prevent rust.

7. The method according to claim 5, wherein the surfaces of said metal balls are solder-plated.

8. The method according to claim 5, which further comprises the step of grinding the metal balls so as to make the heights of the metal balls equal to each other after the firing.

* * * * *